US010008429B2

(12) United States Patent
Shinkawata

(10) Patent No.: US 10,008,429 B2
(45) Date of Patent: Jun. 26, 2018

(54) SEMICONDUCTOR DEVICE AND SEMICONDUCTOR DEVICE MEASURING METHOD

(71) Applicant: RENESAS ELECTRONICS CORPORATION, Tokyo (JP)

(72) Inventor: Hiroki Shinkawata, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days. days.

(21) Appl. No.: 15/788,490

(22) Filed: Oct. 19, 2017

(65) Prior Publication Data

US 2018/0040523 A1    Feb. 8, 2018

Related U.S. Application Data

(63) Continuation of application No. 15/060,360, filed on Mar. 3, 2016, now Pat. No. 9,824,945.

(30) Foreign Application Priority Data

Mar. 30, 2015  (JP) .................................. 2015-070426

(51) Int. Cl.
  *H01L 23/58* (2006.01)
  *H01L 21/66* (2006.01)
(52) U.S. Cl.
  CPC .................................. *H01L 22/34* (2013.01)
(58) Field of Classification Search
  None
  See application file for complete search history.

(56) References Cited

U.S. PATENT DOCUMENTS 6,503,765 B1    1/2003   Chao et al.
6,683,465 B2    1/2004   Fetterman et al.
                         (Continued)

FOREIGN PATENT DOCUMENTS

JP    2002-110753 A    4/2002
JP    2004-537859 A   12/2004
JP    2005-203578 A    7/2005

OTHER PUBLICATIONS

Non-Final Office Action issued in U.S. Appl. No. 15/060,360, dated Mar. 31, 2017.

(Continued)

*Primary Examiner* — Thien F Tran
(74) *Attorney, Agent, or Firm* — McDermott Will & Emery LLP

(57) ABSTRACT

A semiconductor device reduces measurement time. The semiconductor device according to an embodiment of the invention includes: plural series-coupled resistance elements for testing; plural switches coupled to a coupling path coupling the resistance elements; and plural selection circuits to select, by turning on or off the switches, a number of the series-coupled resistance elements to be measured as a group. In the semiconductor device: the switches include plural first switches coupled to plural groups of the resistance elements, each of the groups including N (N=2 or a larger integer) of the resistance elements; and the selection circuits turn the first switches on or off and thereby select a number of the series-coupled resistance elements to be measured as a group, the number equaling the N.

4 Claims, 10 Drawing Sheets

(56) References Cited

U.S. PATENT DOCUMENTS

| | | | | |
|---|---|---|---|---|
| 7,615,824 B2* | 11/2009 | Koyama | ............ | H01L 27/0802 |
| | | | | 257/350 |
| 2003/0082836 A1 | 5/2003 | Fetterman et al. | | |
| 2007/0057345 A1* | 3/2007 | Sasaki | ................ | H01L 27/0802 |
| | | | | 257/536 |
| 2013/0039112 A1* | 2/2013 | Riho | ........................ | G11C 5/02 |
| | | | | 365/63 |

OTHER PUBLICATIONS

Notice of Allowance issued in U.S. Appl. No. 15/060,360, dated Aug. 7, 2017.

\* cited by examiner

| SELECT-abcd | INPUT 1 | INPUT 2 |
|---|---|---|
| 2 SERIES-COUPLED | 0 | 0 |
| 4 SERIES-COUPLED | 0 | 1 |
| 8 SERIES-COUPLED | 1 | 0 |
| 0 SERIES-COUPLED | 1 | 1 |

SEMICONDUCTOR DEVICE AND SEMICONDUCTOR DEVICE MEASURING METHOD

CROSS-REFERENCE TO RELATED APPLICATIONS

This application is a continuation of U.S. application Ser. No. 15/060,360, filed Mar. 3, 2016, which claims the benefit of Japanese Patent Application No. 2015-070426 filed on Mar. 30, 2015 including the specification, drawings and abstract is incorporated herein by reference in its entirety.

BACKGROUND

The present invention relates to a semiconductor device and a semiconductor device measuring method and, more particularly, relates to a test element group (TEG) for testing a semiconductor device.

TEGs are used to secure the reliability of semiconductor devices such as semiconductor integrated circuits. For a semiconductor device, the manufacturing process, circuit characteristics and device reliability are evaluated by characteristic evaluation made using TEGs. When a semiconductor device is in a manufacturing stage, the device reliability is evaluated based on the results of measurement made using TEGs. Based on the evaluation results, the device manufacturing process or circuit design is modified. In the case of a finished semiconductor device, the device reliability is evaluated and whether the device is faultless is determined.

Generally, TEGs for electric characteristics control are provided in scribe regions formed over semiconductor wafers. The scribe regions include scribe lines formed to isolate individual semiconductor chips. In recent years, with semiconductor circuits being formed in higher integration density and with the types of transistors used and the number of wiring layers included in semiconductor circuits tending to increase, the number of device evaluation items to be managed has been increasing. As a result, the numbers of testing elements included in TEGs have also been increasing. Under such circumstances, various TEG configurations and measuring methods using TEGs have been proposed.

For example, Japanese Unexamined Patent Application Publication (Translation of PCT Application) No. 2004-537859 discloses a technique used to design a testing configuration in which a test is performed to determine whether a via-hole or contact included in a via-hole or contact chain has an abnormally high resistance. Japanese Unexamined Patent Application Publication No. 2005-203578 discloses a technique aimed at evaluating, with high sensitivity, contacts or via-holes in a large scale and in a short period of time. In Japanese Unexamined Patent Application Publication No. 2002-110753, a technique is disclosed according to which, corresponding to the contacts included in an IC, as many contacts for evaluation as possible are formed and the contacts for evaluation are individually evaluated to enable highly reliable contact characteristic evaluation.

SUMMARY

In the measuring methods using TEGs configured as disclosed in the above patent documents, the addresses of resistance elements including via-holes or contacts are sequentially specified and the resistance values of the resistance elements are sequentially calculated. In such methods, measuring a large number of resistance elements and evaluating their resistance variations takes a very long measurement time.

Other objects and novel features of the present invention will become apparent from the following description and the attached drawings.

A semiconductor device according to an embodiment of the invention includes: plural series-coupled resistance elements for testing; plural switches coupled to a coupling path coupling the resistance elements; and plural selection circuits to select, by turning on or off the switches, a number of the series-coupled resistance elements to be measured as a group.

More preferably, in the semiconductor device: the switches include plural first switches coupled to plural groups of the resistance elements, each of the groups including N (N=2 or a larger integer) of the resistance elements; and the selection circuits turn the first switches on or off and thereby select a number of the series-coupled resistance elements to be measured as a group, the number equaling the N.

A semiconductor device measuring method according to an embodiment of the invention includes a measurement step in which: a resistance measuring device and the semiconductor device are electrically coupled; switches specified by a specification made by the resistance measuring device are turned on by corresponding selection circuits; and resistance measurement is performed on as many series-coupled resistance elements as corresponding to the switches turned on.

More preferably, in the semiconductor device measuring method, the measurement step includes a step in which a number of the series-coupled resistance elements to be measured as a group are selected such that the number is 2 or a larger integer.

According to an embodiment of the invention, the time required for measurement can be reduced.

DETAILED DESCRIPTION

Figure 1A:
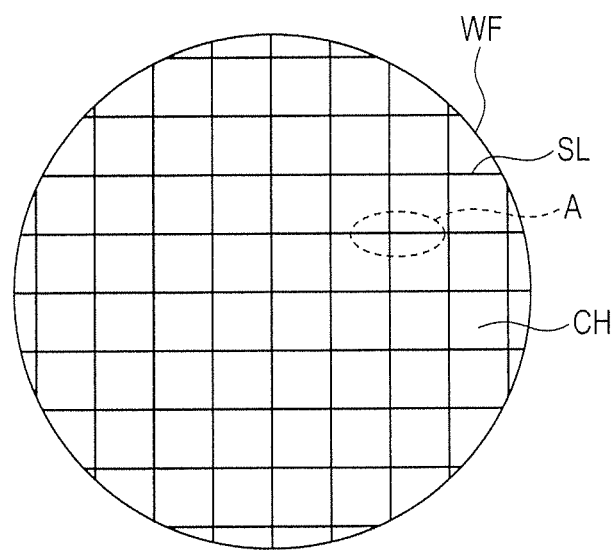
FIGS. 1A and 1B are diagrams illustrating a wafer in connection with a semiconductor device according to a first embodiment of the invention, FIG. 1A being a schematic plan view of an example of chip arrangement over a semiconductor wafer and FIG. 1B being an enlarged plan view of area A shown in broken line in FIG. 1A.

In the following, the description will be divided into two or more sections or will range over two or more embodiments as required for the sake of convenience. Unless otherwise expressed, such sections and embodiments are not mutually irrelevant. For example, among such sections and embodiments, one is a partial or total modification of another, or one elaborates or supplements another.

Also, numbers referred to in the following description of embodiments (for example, numbers representing counts, amounts, ranges, or other numeric values) do not represent defined values, that is, they may be smaller or larger unless otherwise expressed or except when they are apparently defined in principle.

Furthermore, the constituent elements (including element steps) of the following embodiments are not necessarily indispensable unless otherwise expressed or except when they are considered apparently indispensable in principle.

Similarly, the shapes of and positional relationships between constituent elements referred to in the following description are inclusive of those substantially close to or similar to them unless otherwise expressed or except when such shapes and positional relationships are apparently considered strictly defined in principle. This also applies to the numeric values and ranges.

Outline of Embodiments

First, embodiments of the present invention will be outlined in the following. In the embodiment outline, constituent elements of embodiments of the present invention will be referred to with parenthesized reference symbols attached thereto. Such parenthesized reference symbols represent, as specific examples of constituent elements, corresponding constituent elements used in exemplary embodiments being described in detail later.

A semiconductor device according to an embodiment of the invention includes: plural series-coupled resistance elements (resistance elements R) for testing; plural switches (switches S) coupled to a coupling path coupling the resistance elements; and plural selection circuits (selection circuits SEL) to select, by turning on or off the switches, a number of the series-coupled resistance elements to be measured as a group.

More preferably, in the semiconductor device: the switches include plural first switches (switches SaL to SdL, SaH to SdH) coupled to plural groups of the resistance elements, each of the groups including N (N=2 or a larger integer) of the resistance elements; and the selection circuits turn the first switches on or off and thereby select a number of the series-coupled resistance elements to be measured as a group, the number equaling the N.

A semiconductor device measuring method according to an embodiment of the invention includes a measurement step (FIG. 5) in which: a resistance measuring device and the semiconductor device are electrically coupled; switches specified by a specification made by the resistance measuring device are turned on by corresponding selection circuits; and resistance measurement is performed on as many series-coupled resistance elements as corresponding to the switches turned on.

More preferably, in the semiconductor device measuring method, the measurement step includes a step (S1) in which a number of the series-coupled resistance elements to be measured as a group are selected such that the number is 2 or a larger integer.

Exemplary embodiments based on the above embodiment outline will be described in detail with reference to drawings. In all drawings referred to in describing the following embodiments, identical parts are, as a rule, denoted by identical or related reference symbols. Description will not be repeated for such identical parts.

First Embodiment

A semiconductor device and a measuring method for the semiconductor device according to a first embodiment of the present invention will be described with reference to FIGS. 1 to 10.

In the semiconductor device according to the first embodiment, TEGs for electric characteristics control are provided in scribe regions formed over a semiconductor wafer. The scribe regions include scribe lines formed to isolate individual semiconductor chips. To secure the reliability of a semiconductor device, the semiconductor device is subjected to characteristics evaluation performed using TEGs, and the semiconductor device is evaluated as to the manufacturing process, circuit characteristics and reliability. When a semiconductor device is in a manufacturing stage, the device reliability is evaluated based on the results of measurement made using TEGs. Based on the evaluation results, the device manufacturing process or circuit design is modified. In the case of a finished semiconductor device, the device reliability is evaluated and whether the device is faulty or not is determined.

<Semiconductor Wafer>

Figure 1B:
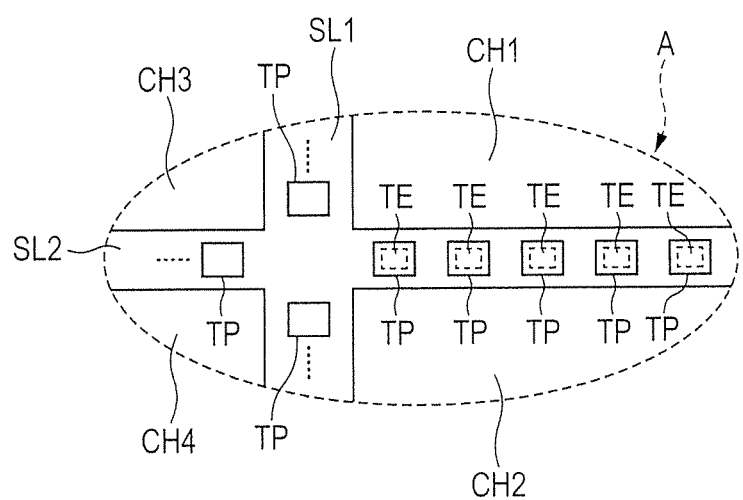

FIGS. 1A and 1B are diagrams illustrating a wafer in connection with the semiconductor device according to the first embodiment. FIG. 1A is a schematic plan view of an example of chip arrangement over a semiconductor wafer. FIG. 1B is an enlarged plan view of area A shown in broken line in FIG. 1A.

Referring to FIG. 1A, plural semiconductor chips CH are arrayed over a semiconductor wafer WF. A target semiconductor circuit device is formed over each semiconductor chip CH. The scribe lines SL are formed over the semiconductor wafer WF to isolate the individual semiconductor chips CH to be separately packaged. After completion of a wafer test process, the semiconductor chips CH formed over the semiconductor wafer WF are separated by dicing the semiconductor wafer WF along the scribe lines SL. As being described in detail later, test elements and test pads configuring TEGs are provided in the regions where the scribe lines SL are formed.

Referring to FIG. 1B showing an enlarged view of the area A, shown in broken line in FIG. 1A, formed over the semiconductor wafer WF, semiconductor chips CH1 to CH4 are arranged to mutually oppose across scribe lines SL1 and SL2. The scribe lines SL1 and SL2 cross each other isolating the semiconductor chips CH1 to CH4 from one another.

TEGs are provided in the scribe lines SL1 and SL2. In FIG. 1B, only the TEG provided in the scribe region between the semiconductor chips CH1 and CH2 is representatively shown. In the scribe region between the semiconductor chips CH1 and CH2, test pads TP and test elements TE are aligned to overlap in a planar view. As shown in FIG. 1B, each test element TE is formed under each test pad TP, but it is allowable to arrange a single test element TE correspondingly to a predetermined number of test pads.

Compared with a planar layout with alternately arranged test elements and test pads, arranging test elements TE under test pads TP such that the test elements TE are overlapped by the test pads TP makes it possible to arrange two times as many test pads TP and test elements TE without requiring any increase in the space to be used. Namely, the number of test elements can be increased to increase the number of items to be controlled.

Referring to FIG. 1B, TEGs are also provided over the scribe line SL1 and in the region of the scribe line SL2 between the semiconductor chips CH3 and CH4, but the TEGs in such regions are, in FIG. 1B, represented by representative test pads TP. The TEGs are provided in the regions of the scribe lines SL correspondingly to the semiconductor chips CH.

<TEG>

Figure 2:
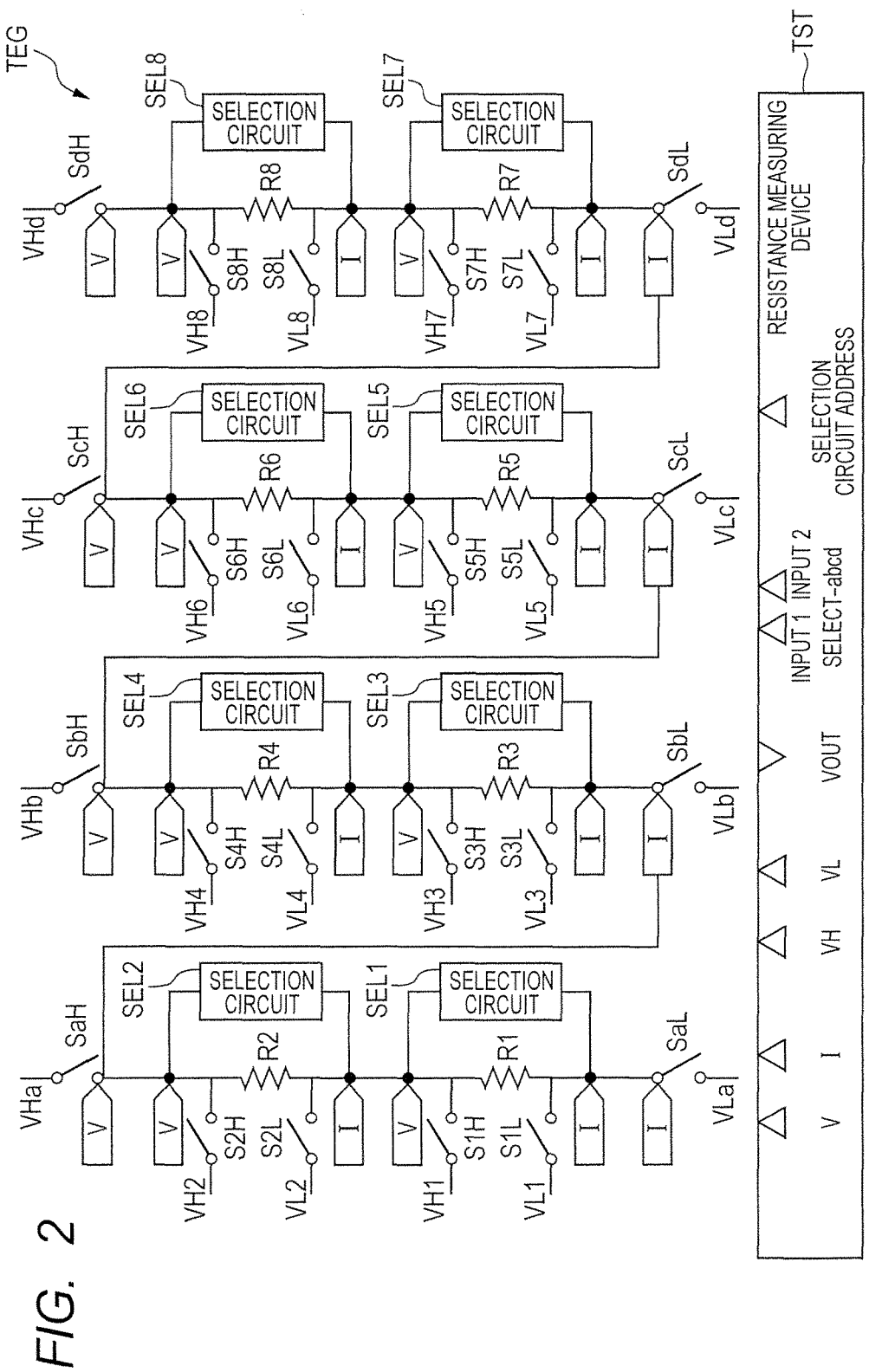
FIG. 2 is a configuration diagram schematically showing an example circuit configuration of a TEG according to the first embodiment of the invention.

FIG. 2 is a configuration diagram schematically showing an example circuit configuration of a TEG according to the first embodiment. In FIG. 2, in addition to the TEG circuit configuration, a resistance measuring device for measuring the semiconductor device using the TEG is also shown.

The TEG shown in FIG. 2 includes test elements TE such as resistance elements R1 to R8, switches SaL to SdL, SaH to SdH, S1L to S8L, S1H to S8H, and selection circuits SEL1 to SEL8. These test elements may be collectively denoted as resistance elements R, switches S, and selection circuits SEL, respectively.

Resistance elements R1 to R8 are resistance elements for testing coupled in series. Switches SaL to SdL, SaH to SdH, S1L to S8L, S1H to S8H are coupled to a coupling path coupling the resistance elements R. Selection circuits SEL1 to SEL8 turn the switches S on or off to select a number of series-coupled resistance elements R to be measured as a group.

The TEG shown in FIG. 2 also includes test pads TP such as pads V, I, VH (VHa to VHd, VH1 to VH8), VL (VLa to VLd, VL1 to VL8). V represents pads supplied with voltage. I represents pads supplied with electric current. VH (VHa to VHd, VH1 to VH8) represents pads for selecting high potential sides of resistance elements R. VL (VLa to VLd, VL1 to VL8) represents pads for selecting low potential sides of resistance elements R.

The eight resistance elements R1 to R8 shown in FIG. 2 are series-coupled. The resistance elements R1 to R8 each have two ends, i.e. a first end and a second end. The second end of resistance element R1 is coupled to the first end of resistance element R2. Similarly, the second end of resistance element R2 is coupled to the first end of resistance element R3. The second end of resistance element R3 is coupled to the first end of resistance element R4. The second end of resistance element R4 is coupled to the first end of resistance element R5. The second end of resistance element R5 is coupled to the first end of resistance element R6. The second end of resistance element R6 is coupled to the first end of resistance element R7. The second end of resistance element R7 is coupled to the first end of resistance element R8.

Referring to FIG. 2, the switches S total 24 including switches SaL, SaH, SbL, SbH, ScL, ScH, SdL, SdH, S1L, S1H, S2L, S2H, S3L, S3H, S4L, S4H, S5L, S5H, S6L, S6H, S7L, S7H, S8L, S8H.

Of the 24 switches S, switches SaL, SaH, SbL, SbH, ScL, ScH, SdL, SdH are first switches each coupled to a group of as many as N (N=two or a larger integer) resistance elements R. For example, switches SaL and SaH are each coupled between the end on one side of series-coupled resistance elements R1 and R2 and the pad, VLa or VHa, on the corresponding side. To be more specific, switch SaL is coupled between the first end of resistance element R1 and pad VLa, and switch SaH is coupled between the second end of resistance element R2 and pad VHa.

Similarly, switches SbL and SbH are each coupled between one end of series-coupled resistance elements R3 and R4 and one of pads VLb and VHb. Switches ScL and ScH are each coupled between one end of series-coupled resistance elements R5 and R6 and one of pads VLc and VHc. Switches SdL and SdH are each coupled between one end of series-coupled resistance elements R7 and R8 and one of pads VLd and VHd.

These switches SaL, SaH, SbL, SbH, ScL, ScH, SdL, SdH are turned on or off by the corresponding ones of the selection circuits SEL to select a number (N) of series-coupled resistance elements R to be measured as a group. To be more specific, N represents a power of 2, and the number of series-coupled resistance elements R is selected out of a group of powers of 2. In the example configuration shown in FIG. 2 including the eight series-coupled resistance elements R1 to R8, the number of series-coupled resistance elements to be measured as a group can be selected out of 2, 4, and 8.

Of the 24 switches S, switches S1L, S1H, S2L, S2H, S3L, S3H, S4L, S4H, S5L, S5H, S6L, S6H, S7L, S7H, S8L, S8H are second switches each coupled to one end of one of the resistance elements R. For example, switches S1L and S1H are each coupled between one end of resistance element R1 and the pad, VL1 or VH1, on the corresponding side. To be more specific, switch S1l is coupled between the first end of resistance element R1 and pad VL1, and switch S1H is coupled between the second end of resistance element R1 and pad VH1.

Similarly, switches S2L and 52H are each coupled between one end of resistance element R2 and the pad, VL2 or VH2, on the corresponding side. Switches S3L and S3H are each coupled between one end of resistance element R3 and the pad, VL3 or VH3, on the corresponding side. Switches S4L and S4H are each coupled between one end of resistance element R4 and the pad, VL4 or VH4, on the corresponding side. Switches S5L and S5H are each coupled between one end of resistance element R5 and the pad, VL5 or VH5, on the corresponding side. Switches S6L and S6H are each coupled between one end of resistance element R6 and the pad, VL6 or VH6, on the corresponding side. Switches S7L and S7H are each coupled between one end of resistance element R7 and the pad, VL7 or VH7, on the corresponding side. Switches S8L and S8H are each coupled between one end of resistance element R8 and the pad, VL8 or VH8, on the corresponding side.

These switches S1L, S1H, S2L, S2H, S3L, S3H, S4L, S4H, S5L, S5H, S6L, S6H, S7L, S7H, S8L, S8H are turned on or off by the corresponding ones of the selection circuits SEL to select a number of series-coupled resistance elements R to be measured as a group.

In FIG. 2, eight selection circuits SEL, i.e. SEL1 to SEL8, are shown corresponding to eight resistance elements R1 to R8. The eight selection circuits SEL are respectively coupled to the corresponding resistance elements R1 to R8. For example, selection circuit SEL1 is coupled to resistance element R1. Similarly, selection circuit SEL2 is coupled to resistance element R2. Selection circuit SEL3 is coupled to resistance element R3. Selection circuit SEL4 is coupled to resistance element R4. Selection circuit SEL5 is coupled to resistance element R5. Selection circuit SEL6 is coupled to resistance element R6. Selection circuit SEL7 is coupled to resistance element R7. Selection circuit SEL8 is coupled to resistance element R8.

These selection circuits SEL1, SEL2, SEL3, SEL4, SEL5, SEL6, SEL7, SEL8 respectively turn on or off the corresponding switches among switches S1L, S1H, S2L, S2H, S3L, S3H, S4L, S4H, S5L, S5H, S6L, S6H, S7L, S7H, S8L, S8H to select a number of series-coupled resistance elements R to be measured as a group. The configuration of each selection circuit SEL will be described later with reference to FIG. 6.

For example, selection circuit SEL1 turns the corresponding pair of switches S1L and S1H on or off. Similarly, selection circuit SEL2 turns the corresponding pair of switches S2L and S2H on or off. Selection circuit SEL3 turns the corresponding pair of switches S3L and S3H on or off. Selection circuit SEL4 turns the corresponding pair of switches S4L and S4H on or off. Selection circuit SEL5 turns the corresponding pair of switches S5L and S5H on or off. Selection circuit SEL6 turns the corresponding pair of switches S6L and S6H on or off. Selection circuit SEL7 turns the corresponding pair of switches S7L and S7H on or off. Selection circuit SEL8 turns the corresponding pair of switches S8L and S8H on or off.

The TEG of the present embodiment includes selection circuits SEL (SELa, SELb, SELc, SELd), not shown in FIG. 2, that turn on or off the corresponding switches among switches SaL, SaH, SbL, SbH, ScL, ScH, SdL, SdH and, thereby, select a number of series-coupled resistance elements to be measured as a group such that the number is a power of 2 (out of 2, 4, and 8). The configuration of each of the selection circuits SEL will be described later with reference to FIG. 7.

For example, selection circuit SELa turns the corresponding switches SaL and SaH on or off. Similarly, selection circuit SELb turns the corresponding switches SbL and SbH on or off. Selection circuit SELc turns the corresponding switches ScL and ScH on or off. Selection circuit SELd turns the corresponding switches SdL and SdH on or off.

Referring to FIG. 2, a resistance measuring device TST includes pins V, I, VH, VL, VOUT which are probe pins. Pin V outputs a voltage. Pin I outputs a current. Pin VH selects a higher potential side. Pin VL selects a lower potential side. Pin VOUT receives an output voltage. The resistance measuring device TST also includes select-abcd pins to control turning on/off of switches SaL, SaH, SbL, SbH, ScL, ScH, SdL, SdH. The resistance measuring device TST further includes a selection circuit address pin for selecting resistance elements R1 to R8 and for controlling turning on/off of switches S1L, S1H, S2L, S2H, S3L, S3H, S4L, S4H, S5L, S5H, S6L, S6H, S7L, S7H, S8L, S8H.

When measuring a semiconductor device, probe pins V, I, VH, VL of the resistance measuring device TST are electrically coupled to test pads V, I, VH (VHa to VHd, VH1 to VH8) and VL (VLa to VLd, VL1 to VL 8). Subsequently, the selection circuits SEL turn on the switches selected, via the select-abcd pins of the resistance measuring device TST, out of the switches SaL, SaH, SbL, SbH, ScL, ScH, SdL, SdH. This makes it possible to measure the resistance of those series-coupled resistance elements, among R1 to R8, corresponding to the turned-on switches.

Figures 3, 4:
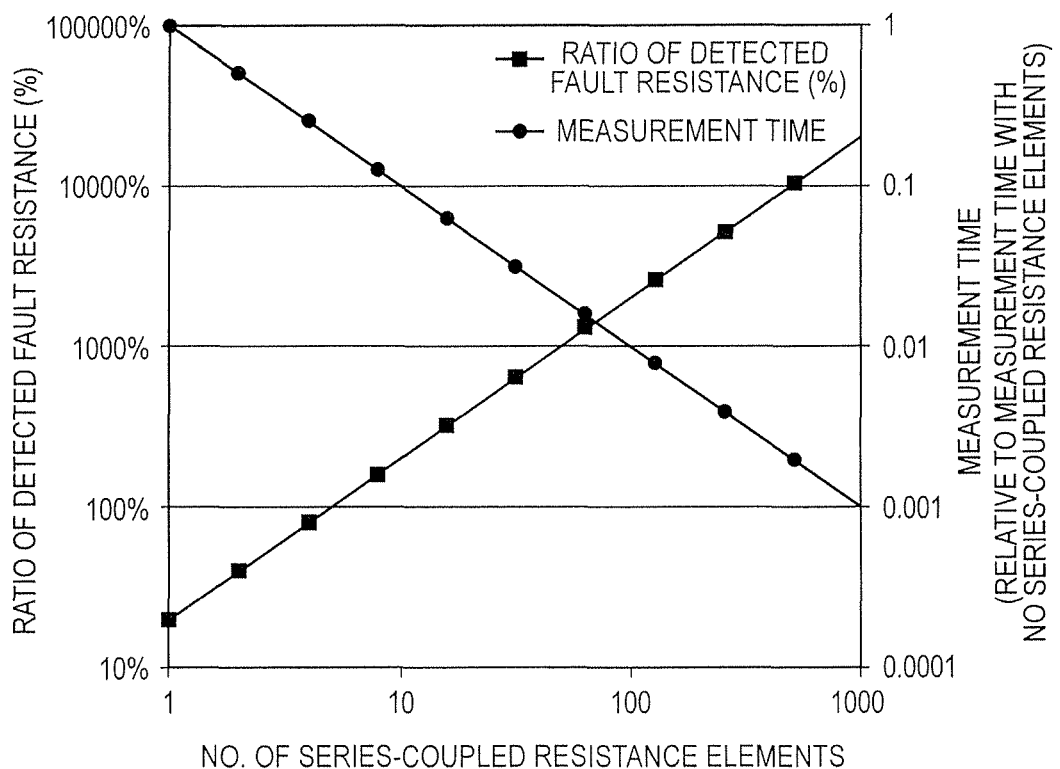
FIG. 3 shows example input signals for selecting a number of series-coupled resistance elements to be measured as a group.
FIG. 4 is a graph illustrating an example of relationship between the number of series-coupled resistance elements to be measured as a group, measurement time, and ratio of detected fault resistance.

For switch selection via the select-abcd pins, a two-bit signal inputted, as shown in FIG. 3, to input 1 and input 2 pins included in the select-abcd pins is used. FIG. 3 shows example input signals for selecting a number of series-coupled resistance elements R to be measured as a group.

For example, inputting "0" from both input 1 pin and input 2 pin makes it possible to measure the resistance of two series-coupled resistance elements R at a time. For example, when switches SaL and SaH are turned on, two resistance elements R1 and R2 can be measured. Similarly, when switches SbL and SbH are turned on, two resistance elements R3 and R4 can be measured. When switches ScL and ScH are turned on, two resistance elements R5 and R6 can be measured. When switches SdL and SdH are turned on, two resistance elements R7 and R8 can be measured. In this case compared with cases in which one resistance element is measured at a time, the measurement time can be reduced to ½.

When "0" is inputted from input 1 pin and "1" is inputted from input 2 pin, the resistance of four resistance elements R can be measured at a time. For example, when switches SaL and SbH are turned on, four resistance elements R1 to R4 can be measured. Similarly, when switches ScL and SdH are turned on, four resistance elements R5 to R8 can be measured. In this case compared with cases in which one resistance element is measured at a time, the measurement time can be reduced to ¼.

When "1" is inputted from input 1 pin and "0" is inputted from input 2 pin, switches SaL and SdH are turned on making it possible to measure the resistance of all eight resistance elements R1 to R8 at a time. In this case compared with cases in which one resistance element is measured at a time, the measurement time can be reduced to ⅛.

As described above, the measurement time can be reduced by increasing the number of series-coupled resistance elements to be measured as a group. However, increasing the number of series-coupled resistance elements to be measured as a group increases ratio of detected fault resistance. It is, therefore, necessary to determine appropriate measurement time for the resistance elements to be measured and ratio of detected fault resistance to be measured.

FIG. 4 is a graph illustrating an example of relationship between the number of series-coupled resistance elements to be measured as a group, measurement time, and ratio of detected fault resistance. In FIG. 4, the horizontal axis represents the number of series-coupled resistance elements, the right vertical axis represents measurement time (relative to the measurement time required when no resistance elements are series-coupled), and the left vertical axis represents ratio of detected fault resistance (%). The graph is plotted based on the numbers of series-coupled resistance elements 1, 2, 4, 8, 16, 32, 64, 128, 256 and 512. The ratio of detected fault resistance is calculated based on the assumption that, where a normal variation range for $3\alpha$ is ±10%, a resistance variation of 20% or higher indicates a fault.

As seen from FIG. 4, as the number of series-coupled resistance elements to be measured as a group increases, the measurement time decreases and the ratio of detected fault resistance increases. In the example shown in FIG. 4, the line representing measurement time and the line representing ratio of detected fault resistance intersect where the number of series-coupled resistance elements is about 64. At the intersection, both the measurement time and the ratio of detected fault resistance should be considered acceptable. When the number of series-coupled resistance elements is increased beyond the number at the intersection, i.e. about 64, the measurement time further decreases and the ratio of detected fault resistance further increases. Conversely, when the number of series-coupled resistance elements is decreased, the measurement time increases and the ratio of detected fault resistance decreases. Thus, with the measurement time and the ratio of detected fault resistance having contradictory characteristics relative to the number of series-coupled resistance elements, it is necessary to appropriately determine the measurement time and ratio of detected fault resistance for the target of measurement.

According to the present embodiment as in related arts, it is possible, by selecting a mode with no series coupling, to individually measure resistance elements R1 to R8 corresponding to specified addresses. For measurement in such a mode, input "1" from each of input 1 pin and input 2 pin as shown in FIG. 3. Then, specify the addresses of switches S1L, S1H, S2L, S2H, S3L, S3H, S4L, S4H, S5L, S5H, S6L, S6H, S7L, S7H, S8L, S8H from the selection circuit address pin of the resistance measuring device TST to turn the switches on. This makes it possible to individually measure the resistances of resistance elements R1 to R8 corresponding to the switches that have been turned on.

For example, when switches S1L and S1H are turned on, resistance element R1 can be measured. Similarly, when switches S2L and S2H are turned on, resistance element R2 can be measured. When switches S3L and S3H are turned on, resistance element R3 can be measured. When switches S4L and S4H are turned on, resistance element R4 can be measured. When switches S5L and S5H are turned on, resistance element R5 can be measured. When switches S6L and S6H are turned on, resistance element R6 can be measured. When switches S7L and S7H are turned on, resistance element R7 can be measured. When switches S8L and S8H are turned on, resistance element R8 can be measured.

In related arts, resistance elements R1 to R8 are individually provided without being series-coupled, so that, like in the mode with no series coupling of the present embodiment, resistance elements R1 to R8 can be measured only individually.

<Measuring Method Using TEG>

Figure 5:
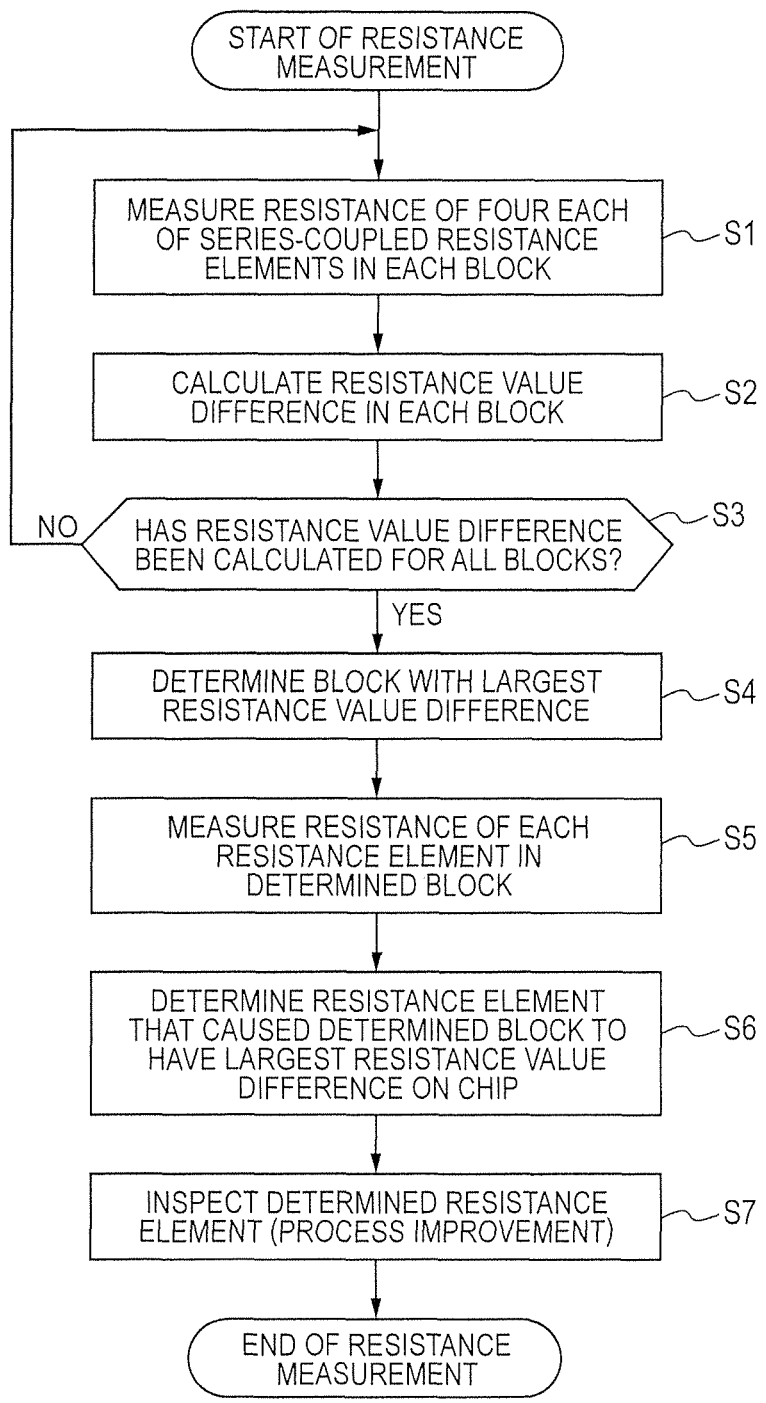
FIG. 5 is a flowchart of an example of a measuring method using a TEG according to the first embodiment of the invention.

As described above, according to the present embodiment in which a TEG is used, the eight resistance elements can be measured in groups of two series-coupled resistance elements, in groups of four series-coupled resistance elements, in a group of eight series-coupled resistance elements, or individually without any series-coupled resistance elements. A measuring method using a TEG will be described in the following with reference to FIG. 5 showing an example flowchart.

First, in S1, out of the eight resistance elements R1 to R8 proximately arranged in a block as shown in FIG. 2, the four resistance elements R1 to R4 in a left-side portion (VLa to VHb) and the four resistance elements R5 to R8 in a right-side portion (VLc to VHd) are respectively measured. Namely, in this resistance measurement, four each of the eight resistance elements are measured as a group of series-coupled resistance elements.

For example, the resistance of the four left-side resistance elements R1 to R4 can be calculated by expression, R14=(VHb−VLa)/I. Similarly, the resistance of the four right-side resistance elements R5 to R8 can be calculated by expression, R58=(VHd−VLc)/I. In these expressions, VHb, VLa, VHd, VLc represent values of voltages supplied to pads VHb, VLa, VHd, VLc and detected at pad VOUT, and I represents a constant current applied from pad I.

Next, in S2, based on the results of measurement made in S1, the difference between the resistance value of the four left-side resistance elements R1 to R4 and the resistance value of the four right-side resistance elements R5 to R8 is calculated.

Then, in S3, it is determined whether S1 for resistance measurement and S2 for calculating the difference between measured resistance values have been completed for every block of resistance elements over the same chip. S1 and S2 are repeated until they have been completed for all blocks of resistance elements over the same chip.

When, in S3, it is determined that S1 and S2 have been completed for all blocks of resistance elements over the same chip, processing advances to S4. In S4, the measured value differences calculated for all blocks of resistance elements over the chip are compared and a block of resistance elements with the largest measured value difference is determined.

Next, in S5, each resistance element included in the block determined in S4 is address-selected and its resistance is measured. Namely, in this measurement, no resistance elements are measured as a series-coupled group.

Referring to FIG. 2, the resistance value of resistance element R1, for example, can be calculated by expression, R1=(VH1−VL1)/I. Similarly, the resistance value of resistance element R2 can be calculated by expression, R2=(VH2−VL2)/I. The values of resistance of other resistance elements R3 to R8 can also be calculated in the same manner.

In S6, based on the measurement results obtained in S5, the resistance element that caused the specific block of resistance elements to have the largest measured value difference is determined.

Subsequently, in S7, the specific resistance element determined in S6 is inspected to determine a factor which made the specific resistance element different from other resistance elements. If the factor is found out to be a process variation, the finding may lead to process improvement.

As described above, all blocks of resistance elements over the chip can be measured. The resistance measurement described above can be performed for every chip included in the semiconductor wafer. Even though, in S1, four each of series-coupled resistance elements are measured as a group, two or eight series-coupled resistance elements can also be measured as a group. Furthermore, two each of series-coupled resistance elements, four each of series-coupled resistance elements and eight each of series-coupled resistance elements may be subjected to resistance measurement in any combination.

<Circuit Configuration of TEG>

Figure 6:
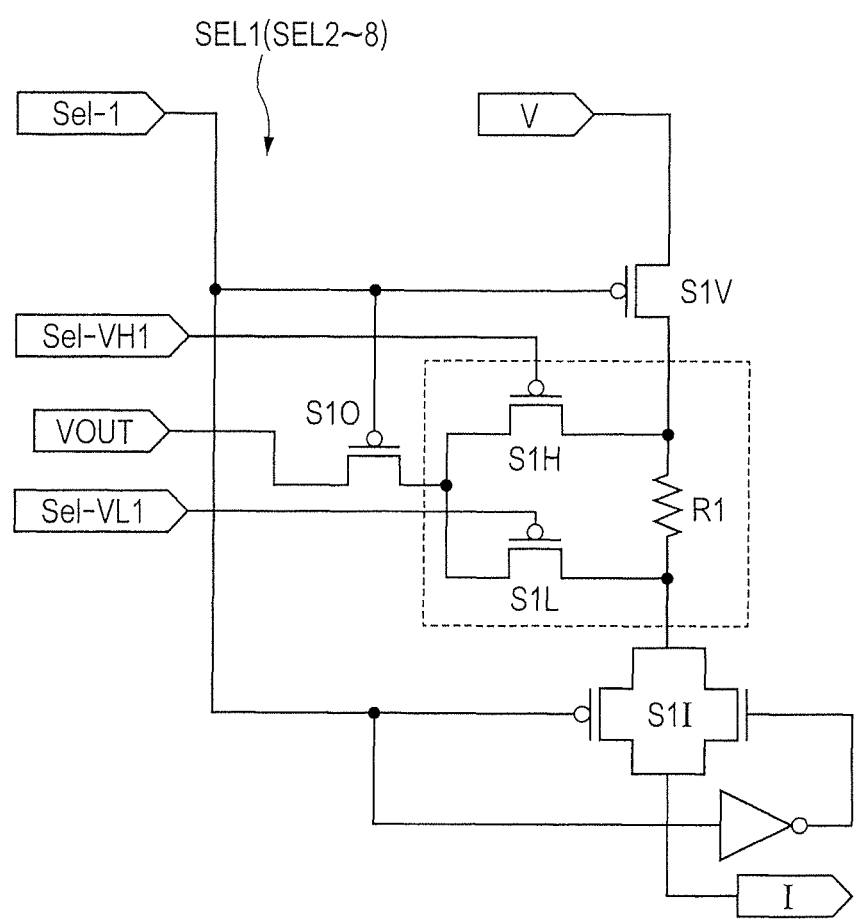
FIG. 6 is a circuit diagram showing an example circuit configuration of a TEG for measuring a resistance element not series-coupled to any other resistance element according to the first embodiment of the invention.
Figure 7:
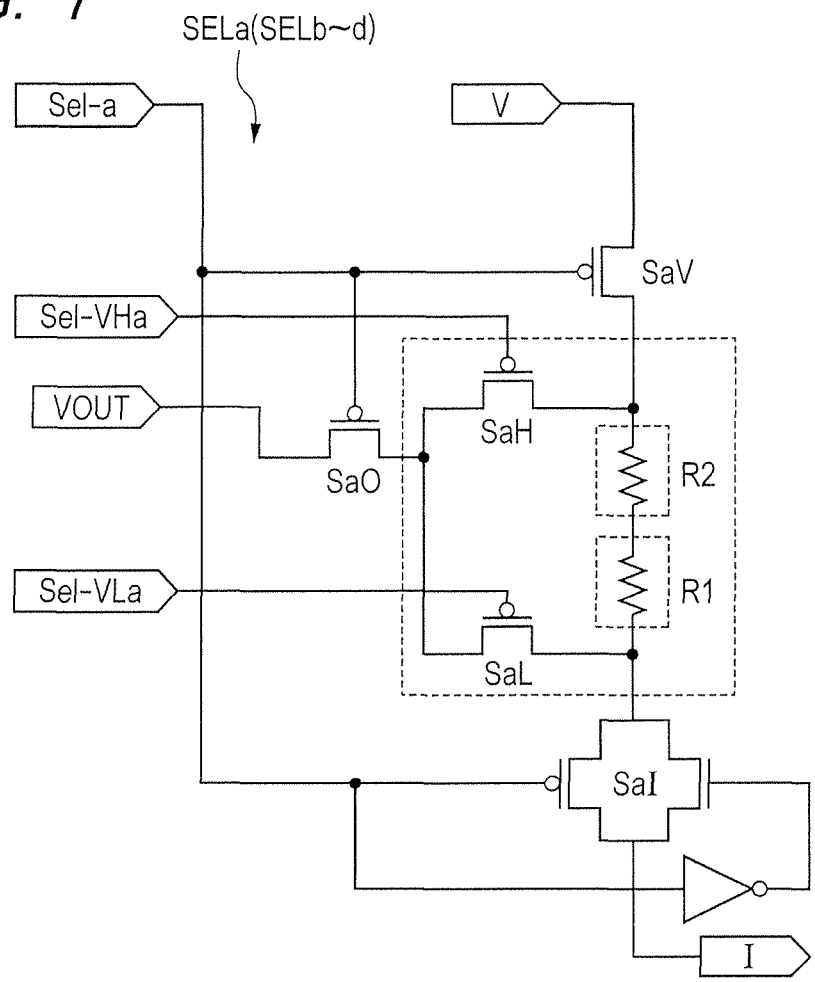
FIG. 7 is a circuit diagram showing an example circuit configuration of a TEG for measuring the resistance of two series-coupled resistance elements as a group according to the first embodiment of the invention.

FIGS. 6 and 7 are diagrams illustrating the circuit configuration of a TEG. FIG. 6 is a circuit diagram showing an example circuit configuration of a TEG for measuring a resistance element not series-coupled to any other resistance element. FIG. 7 is a circuit diagram showing an example circuit configuration of a TEG for measuring the resistance of two series-coupled resistance elements as a group.

In FIG. 6, a portion of a TEG including resistance element R1 to be individually measured without being series-coupled to any other resistance element is shown. As shown in FIG. 6, the portion including the resistance element R1 also includes switches S1L and S1H respectively coupled to the two ends of resistance element R1. A portion including selection circuit SEL1 corresponding to resistance element R1 also includes switches S1V, S1I, S1O. Switches S1L, S1H, S1V, S1O are each composed of a pMOS transistor. Switch S1I forms a CMOS transfer gate including a pMOS transistor and an nMOS transistor.

In FIG. 6, V represents a pad to which voltage is supplied. I represents a pad to which current is supplied. Sel-1 represents an address specification pad corresponding to resistance element R1 selected. Sel-VH1 represents a pad for selecting the high-potential side of the selected resistance element R1. Sel-VL1 represents a pad for selecting the low-potential side of the selected resistance element R1. VOUT represents an output voltage pad corresponding to the selected resistance element R1.

Resistance element R1 has a first end and a second end. Switch S1H has a source coupled to the first end of resistance element R1, a drain coupled to the source of switch S1O and a gate coupled to pad Sel-VH1. Switch S1L has a source coupled to the second end of resistance element R1, a drain coupled to the source of switch S1O and a gate coupled to pad Sel-VL1. Switch S1O has a source coupled to the drains of switches S1H and S1L, a drain coupled to pad VOUT and a gate coupled to pad Sel-1. Switch S1V has a source coupled to pad V, a drain coupled to the first end of resistance element R1 and a gate coupled to pad Sel-1. Switch S1I has a source coupled to the second end of resistance element R1, a drain coupled to pad I and a gate coupled to pad Sel-1.

Switches S1L, S1H, S1V, S1O, S1I are respectively controlled by selection control signals (Sel-1, Sel-VH1, Sel-VL1) supplied to their gates. These switches turn on when the corresponding selection control signals are set to a low-voltage level and turn off when the corresponding selection control signals are set to a high voltage level.

In FIG. 7, a portion of a TEG including resistance elements R1 and R2 to be measured in a series-coupled state is shown. As shown in FIG. 7, the portion including the resistance elements R1 and R2 also includes switches SaL and SaH respectively coupled to the two ends of the series-coupled resistance elements R1 and R2. A portion including selection circuit SELa corresponding to resistance elements R1 and R2 also includes switches SaV, SaI, SaO.

In FIG. 7, V represents a pad to which voltage is supplied. I represents a pad to which current is supplied. Sel-a represents an address specification pad corresponding to resistance elements R1 and R2 selected. Sel-VHa represents a pad for supplying a high voltage to the selected resistance elements R1 and R2. Sel-VLa represents a pad for supplying a low voltage to the selected resistance elements R1 and R2. VOUT represents an output voltage pad corresponding to the selected resistance elements R1 and R2.

The types of switches SaL, SaH, SaV, SaO, SaI and the couplings between the resistance elements R1 and R2 and the respective switches and pads shown in FIG. 7 are similar to those shown in FIG. 6 showing a portion including resistance element R1, so that, for FIG. 7, description of the switch types and couplings will be omitted herein.

As described above, switches SaL and SaH respectively coupled to the two ends of resistance R1 as shown in FIG. 6 and switches SaL and SaH respectively coupled to the two ends of the series-coupled resistance elements R1 and R2 as shown in FIG. 7 each include a pMOS transistor. This is to accurately output a potential on the high-level side without using any booster circuit.

Figure 8:
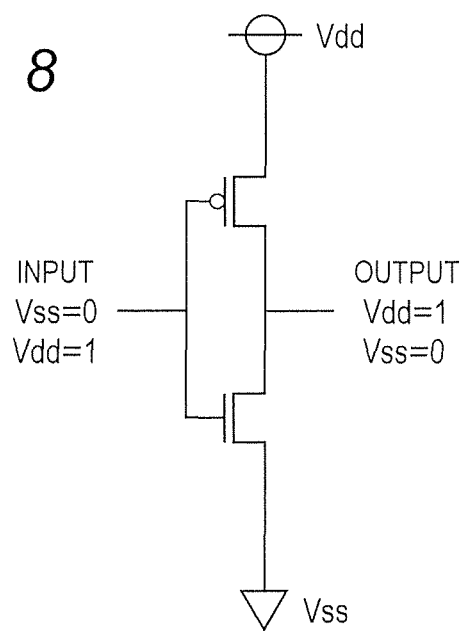
FIG. 8 illustrates an example of an inverter according to the first embodiment of the invention.

Referring to FIG. 8 illustrating an example of an inverter, the inverter includes a pMOS transistor and an nMOS transistor series-coupled between high voltage Vdd and low voltage Vss. For example, when the input signal is low voltage Vss (=0), the pMOS transistor turns on and the nMOS transistor turns off causing high voltage Vdd (=1) to be outputted as an output signal. Conversely, when the input signal is high voltage Vdd (=1), the pMOS transistor turns off and the nMOS transistor turns on causing low voltage Vss (=0) to be outputted as an output signal. In this case, the nMOS transistor is suitable for obtaining low voltage Vss. On the other hand, the pMOS transistor can output high voltage Vdd without voltage degradation. Therefore, for output from a resistance element to be measured, a pMOS transistor capable of conveying relatively high voltage without degradation is more suitable. Thus, by using a pMOS transistor which enables accurate voltage measurement, highly accurate measurement results can be obtained.

<TEG Layout>

Figure 9:
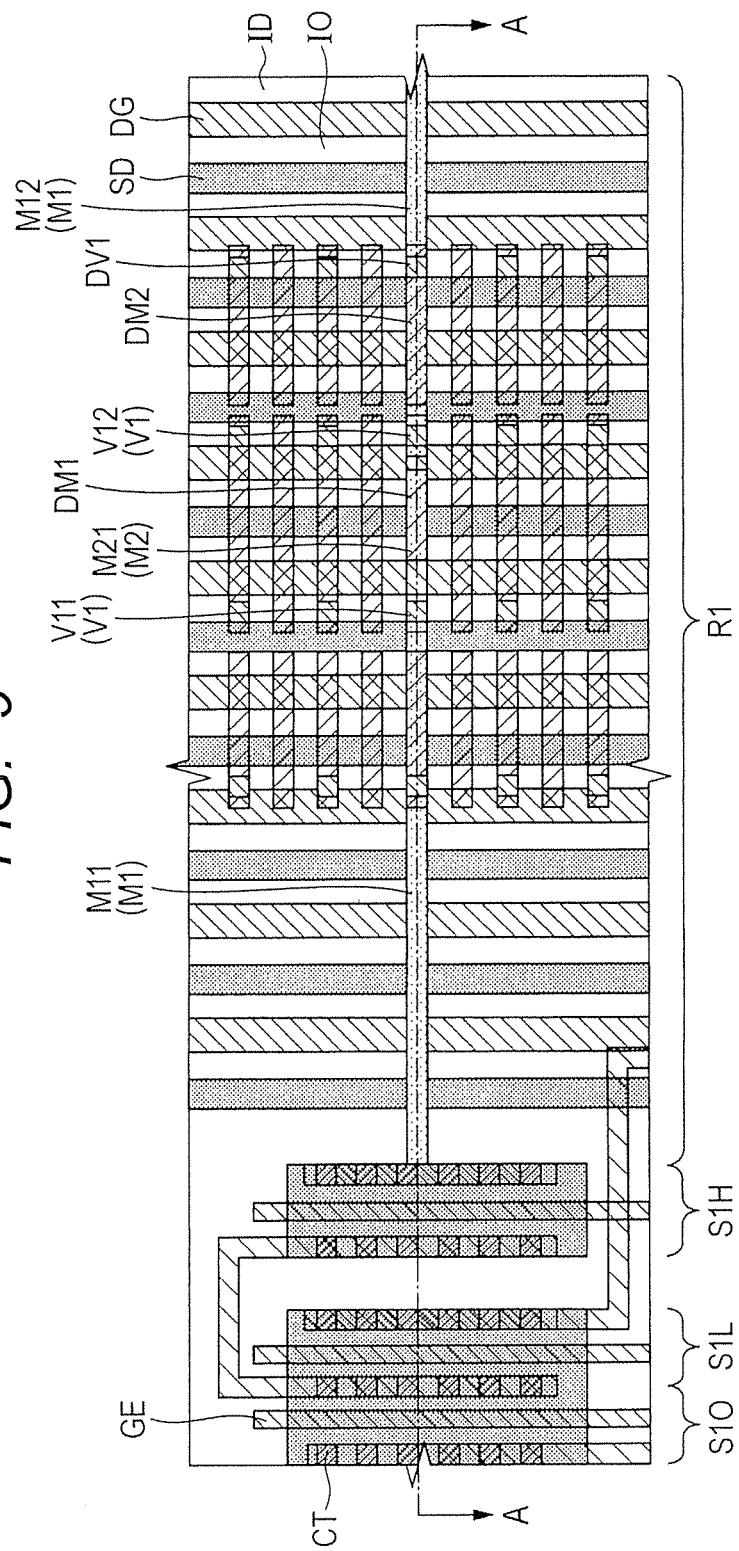
FIG. 9 is a plan view of an example of a TEG layout according to the first embodiment of the invention.
Figure 10:
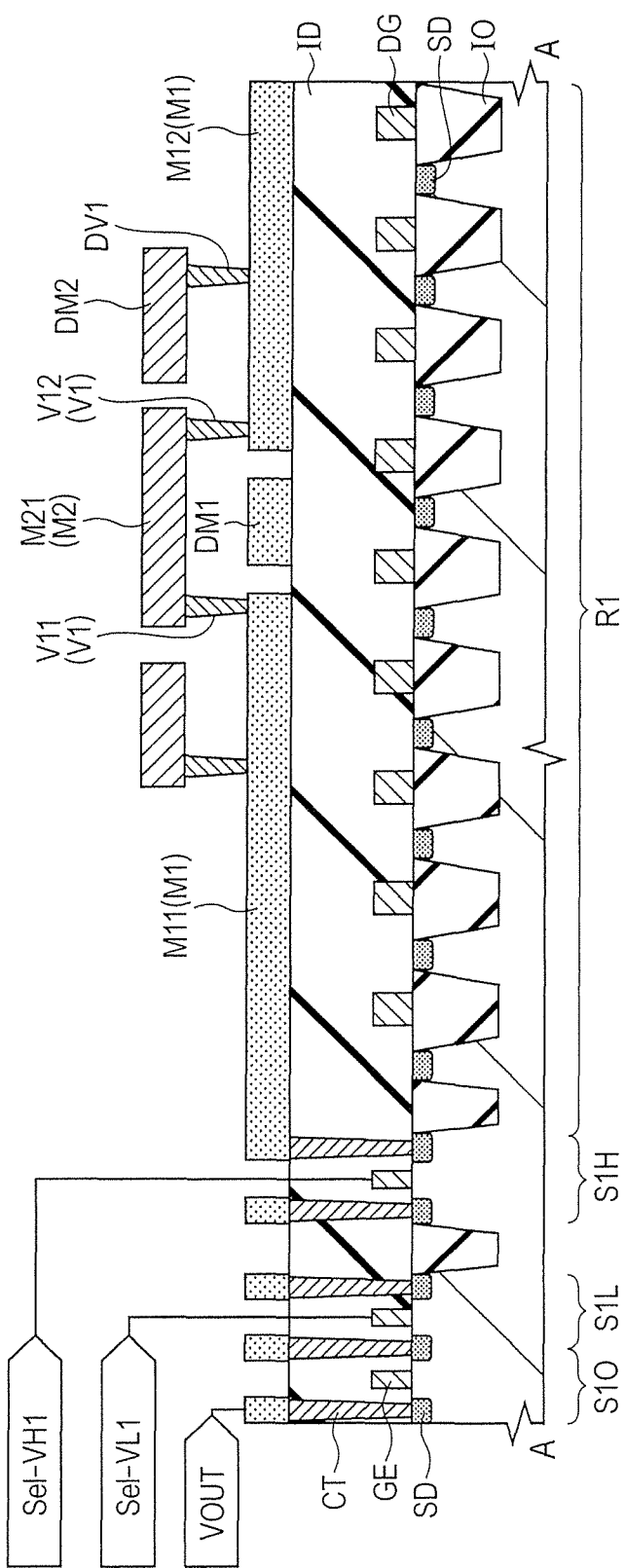
FIG. 10 is a sectional view taken along line A-A in FIG. 9.

FIGS. 9 and 10 are diagrams illustrating a layout of a TEG. FIG. 9 is a plan view of an example of a TEG layout. FIG. 10 is a sectional view taken along line A-A in FIG. 9. The portion of the TEG shown in FIGS. 9 and 10 corresponds to the portion including resistance element R1 shown in FIG. 6 (the portion inside the broken-line frame).

In FIGS. 9 and 10: IO represents an isolation oxide film; DG a dummy gate; ID an interlayer dielectric film; M1 a first-layer metal wiring; M2 a second-layer metal wiring; V1 a via-hole for coupling between the first-layer metal wiring M1 and the second-layer metal wiring M2; SD a source/drain; GE a gate electrode; and CT a contact. Among the first-layer metal wirings M1 and second-layer metal wirings M2, dummy first-layer metal wirings and dummy second-layer metal wirings are represented by DM1 and DM2, respectively. Among the via-holes V1, dummy via-holes are represented by DV1.

Referring to FIGS. 9 and 10, switches S1O, S1L and S1H are arranged in the mentioned order from left to right. Switch S1O is coupled to pad VOUT. Switch S1L is coupled to pad Sel-VL1. Switch S1H is coupled to pad Sel-VH1. Resistance element R1 is provided on the right of the switch S1H. Switches S1O, S1L, S1H each include a gate electrode GE and impurity regions of source/drain SD.

In resistance element R1, the first-layer metal wiring M11, via-hole V11, second-layer metal wiring M21, via-hole V12 and first-layer metal wiring M12 are coupled. The first-layer metal wiring M11 forming the first end of resistance element R1 is coupled to the source (source/drain SD) of switch S1H. The first-layer metal wiring M12 forming the second end of resistance element R1 is coupled to the source (source/drain SD) of switch S1L.

The above constituent parts of the TEG are formed in a process of forming semiconductor integrated circuits over semiconductor chips using materials used to form the semiconductor integrated circuits. For example, the gate electrodes GE and impurity regions of sources/drains SD of switches S1O, S1L, S1H are formed in a process of forming transistors to configure integrated semiconductor circuits. The first-layer metal wiring M1 and the second-layer metal wiring M2 of resistance element R1 are respectively formed in a process of forming a first-layer metal wiring and in a process of forming a second-layer metal wiring. The first-layer metal wiring M1 and the second-layer metal wiring M2 are copper wiring, and the wiring and via-holes (filled) are formed by a damascene method. Contacts CT are normally formed using tungsten plugs. Pads Sel-VH1, Sel-VL1, VOUT for testing are formed using aluminum wiring in the topmost layer.

Effect of First Embodiment

According to the semiconductor device and the measuring method therefor of the first embodiment described above, the time required for measurement can be reduced. Namely, a number, for example, 2, 4, or eight, of the series-coupled resistance elements R to be measured and evaluated at a time as a group can be selected, so that the time required for measurement can be reduced. This is detailed below.

(1) The semiconductor device includes: plural series-coupled resistance elements R for testing; plural switches (S) coupled to a coupling path coupling the resistance elements R; and plural selection circuits SEL to select, by turning on or off the switches S, a number of the series-coupled resistance elements R to be measured as a group. Namely, the selection circuits SEL can select a number of the series-coupled resistance elements R to be measured at a time as a group by turning on or off the switches S, so that the time required for measurement can be reduced.

(2) The switches S include plural switches SaL/H to SdL/H coupled to plural groups of the resistance elements R, each of the groups including N (N=2 or a larger integer) of the resistance elements R. The selection circuits SEL can turn the switches SaL/H to SdL/H on or off and can thereby select a number of the series-coupled resistance elements R to be measured as a group, the number equaling the N.

(3) The N is a power of 2, and the selection circuits SEL can select a number of the series-coupled resistance elements R to be measured as a group such that the number is one of a group of powers of 2.

(4) The selection circuits SEL can select, in accordance with a specification made by a resistance measuring device TST, a number of the series-coupled resistance elements R to be measured as a group such that the number is a power of 2. This makes it possible to measure the resistance of a selected number of the series-coupled resistance elements R at a time, the number being a power of 2.

(5) The switches include switches S1L/H to S8L/H each coupled to one of the two ends of one of the resistance elements R. The selection circuits SEL can select the resistance elements R individually by turning the switches S1L/H to S8L/H on or off, respectively.

(6) The selection circuits SEL can select the resistance elements R individually in accordance with a specification made by a resistance measuring device TST. This makes it possible to select the resistance elements R individually and measure the resistances of the individually selected resistance elements R.

(7) The switches S each have a first end coupled to the coupling path coupling the resistance elements R. and a second end supplied with voltage. This makes it possible to supply voltages to the resistance elements R via the corresponding switches S and perform resistance measurement.

(8) The switches S each include a pMOS transistor. This allows the respective switches S to accurately output potentials on the high-level side. Therefore, voltages can be accurately measured and highly accurate measurement results can be obtained.

(9) The resistance elements R each include a via-hole or a contact. Namely, the resistance elements R including via-holes or contacts can be evaluated.

(10) A semiconductor device measuring method includes a measurement step in which: a resistance measuring device TST and the semiconductor device are electrically coupled; switches S specified by a specification made by the resistance measuring device TST are turned on by corresponding selection circuits SEL; and resistance measurement is performed on as many series-coupled resistance elements R as corresponding to the switches S turned on. Namely, in the measurement step, the resistance of as many resistance elements R as corresponding to the specification made from the resistance measuring device TST can be measured at a time. Since the number of resistance elements R to be measured at a time can be selected, the measurement time can be reduced.

(11) The measurement step includes a step in which a number of the series-coupled resistance elements R to be measured as a group are selected such that the number is 2 or a larger integer. Namely, in the measurement step, two or more of the series-coupled resistance elements R can be selected as a group and the resistance of the two or more series-coupled resistance elements R selected can be measured at a time.

(12) The measurement step includes a step in which a number of the series-coupled resistance elements R to be measured as a group are selected such that the number is one of a group of powers of 2. Namely, in the measurement step, a number of the series-coupled resistance elements R to be measured as a group can be selected, the number being one of a group of powers of 2, and the resistance of the selected series-coupled resistance elements R can be measured.

(13) The measurement step includes a step in which the resistance elements R can be selected individually. Namely, in the measurement step, the series-coupled resistance elements R can be selected individually, and the resistances of the individual series-coupled resistance elements R selected can be measured.

(14) According to the semiconductor device and the measuring method therefor of the first embodiment of the invention, resistance variations among the resistance elements R can be evaluated at high speed and with high accuracy by appropriately selecting, for the target of measurement, the measurement time and the ratio of detected fault resistance that are mutually contradictory relative to the number of series-coupled resistance elements R to be measured as a group. Therefore, the semiconductor device and the measuring method therefor of the first embodiment can be suitably applied to semiconductor devices such as microcomputers required to be highly reliable.

Second Embodiment

A semiconductor device and a measuring method for the semiconductor device according to a second embodiment of the present invention will be described with reference to FIG. 11. The second embodiment will be described focusing on its differences from the first embodiment.

Figure 11:
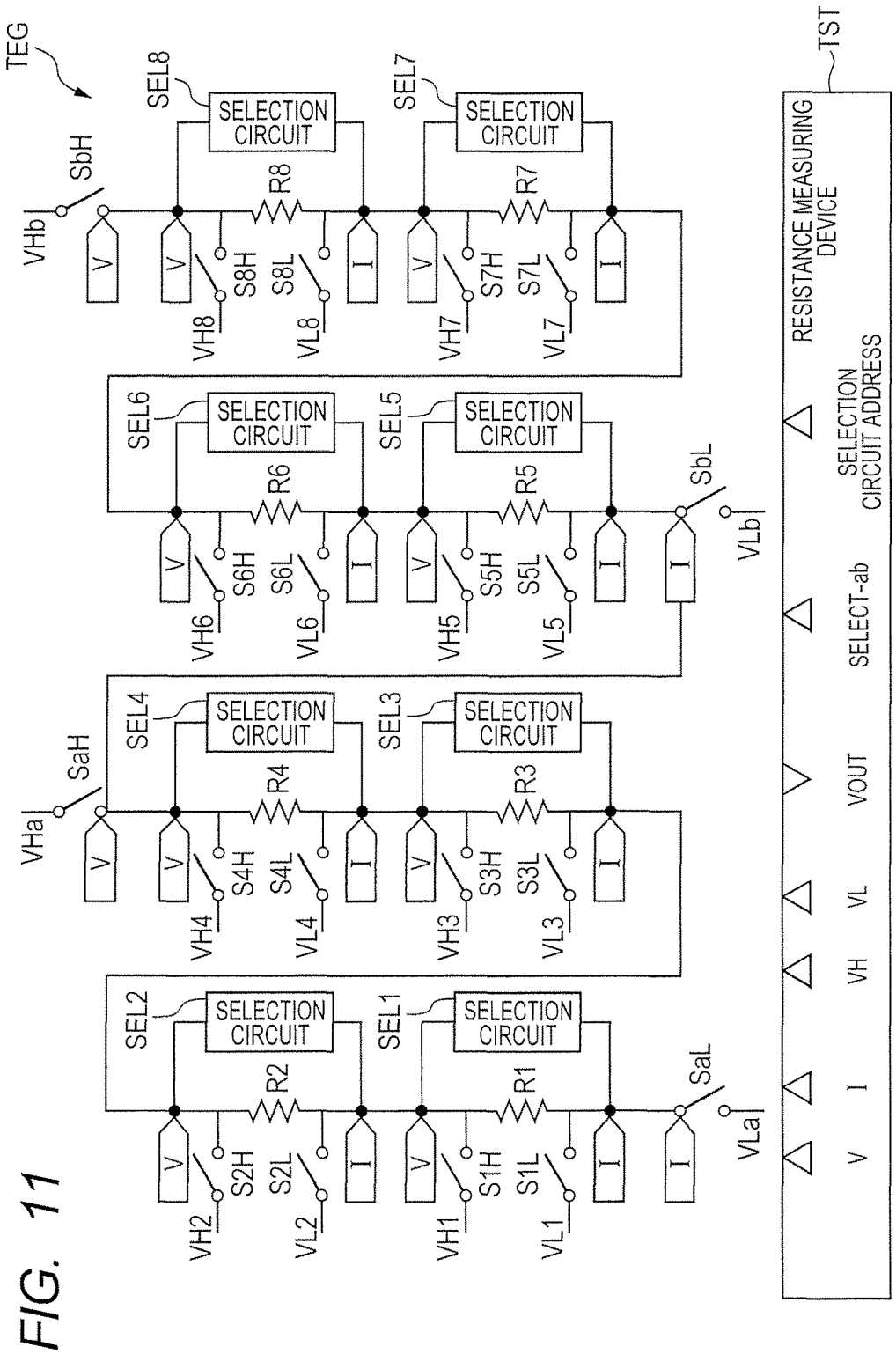
FIG. 11 is a configuration diagram schematically showing an example circuit configuration of a TEG according to a second embodiment of the invention.

FIG. 11 is a configuration diagram schematically showing an example circuit configuration of a TEG according to the second embodiment. In FIG. 11, in addition to the TEG circuit configuration, a resistance measuring device for measuring a semiconductor device using the TEG is also shown.

The TEG shown in FIG. 11 includes series-coupled resistance elements R (R1 to R8) for testing, switches S (SaL, SbL, SaH, SbH, S1L to S8L, S1H to S8H) coupled to a coupling path coupling the resistance elements R, and selection circuits SEL (SEL1 to SEL8) for turning switches S on or off to select a number of series-coupled resistance elements R to be measured as a group. The TEG shown in FIG. 11 includes pads V, I, VH (VHa, VHb, VH1 to VH8), VL (VLa, VLb, VL1 to VL8).

Namely, the TEG of the present embodiment includes switches SaL, SaH, SbL, SbH to enable resistance measurement on four series-coupled resistance elements. The TEG also includes pads VHa, VHb, VLa, VLb corresponding to the switches SaL, SaH, SbL, SbH. For example, switch SaL is coupled between one end of resistance element R1 and pad VLa, and switch SaH is coupled between one end of resistance element R4 and pad VHa. Similarly, switch SbL is coupled between one end of resistance element R5 and pad VLb, and switch SbH is coupled between one end of resistance element R8 and pad VHb.

With the TEG having a circuit configuration as described above, the resistance measuring device TST includes select-ab pin for switch selection. When "0" is inputted from the select-ab pin, four series-coupled resistance elements can be measured as a group. When "1" is inputted from the select-ab pin, individual resistance elements can be measured individually. For example, when switches SaL and SaH are turned on, four series-coupled resistance elements R1 to R4 can be measured. Similarly, when switches SbL and SbH are turned on, four series-coupled resistance elements R5 to R8 can be measured.

Also, when "1" is inputted from the select-ab pin, resistance elements R1 to R8 can be individually measured as in the first embodiment.

According to the semiconductor device and the measuring method therefor of the second embodiment described above, too, an effect similar to that of the first embodiment can be obtained. In addition, according to the second embodiment, one selection pin, i.e. the select-ab pin, for selecting switches SaL, SaH, SbL, SbH is used compared with the two selection pins, i.e. the select-abcd pins, used in the first embodiment. Thus, according to the second embodiment compared with the first embodiment, the number of selection pins can be decreased.

Third Embodiment

A semiconductor device and a measuring method for the semiconductor device according to a third embodiment of the present invention will be described with reference to FIG. 12. The third embodiment will be described focusing on its differences from the first embodiment.

Figure 12:
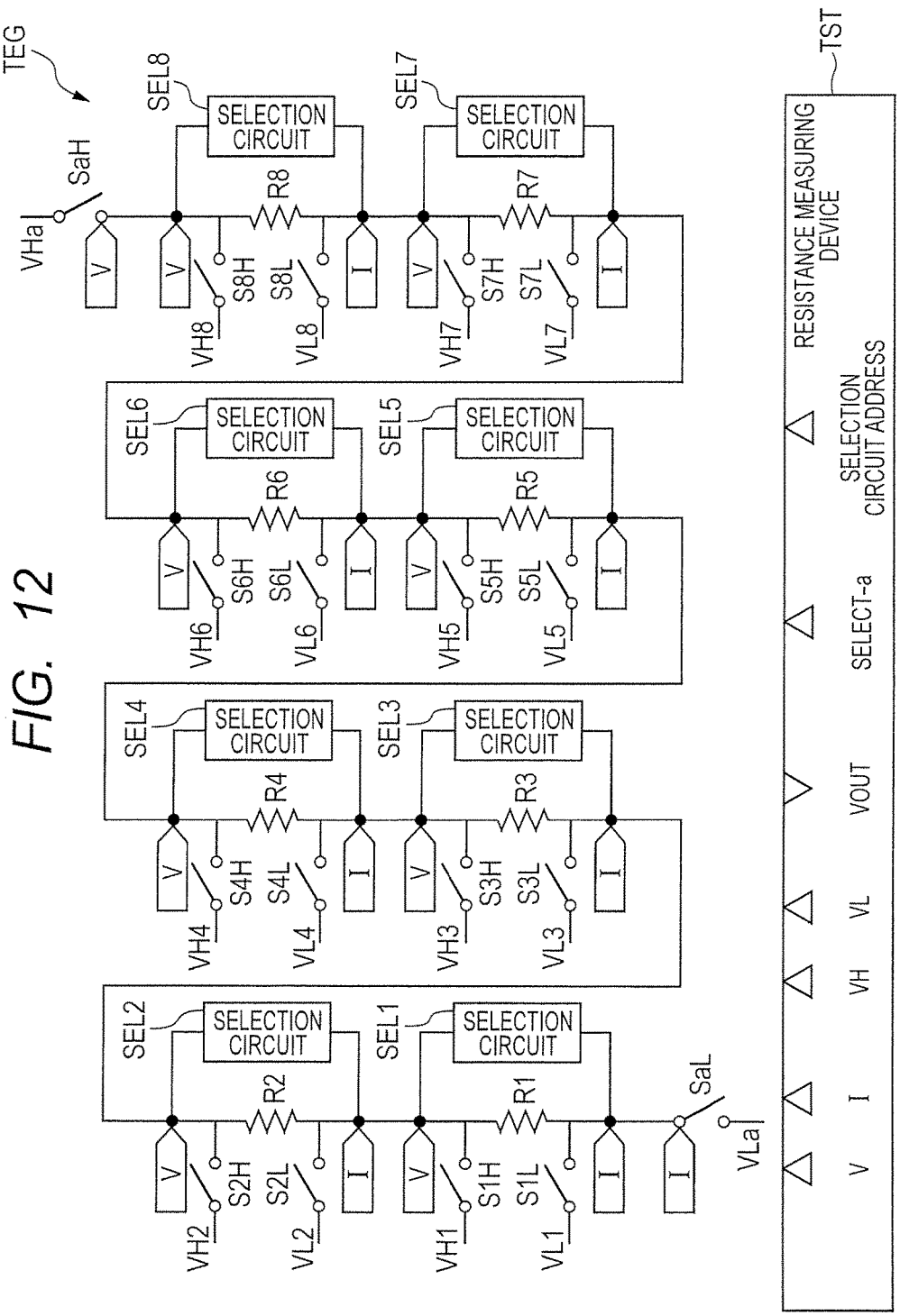
FIG. 12 is a configuration diagram schematically showing an example circuit configuration of a TEG according to a third embodiment of the invention.

FIG. 12 is a configuration diagram schematically showing an example circuit configuration of a TEG according to the third embodiment. In FIG. 12, in addition to the TEG circuit configuration, a resistance measuring device for measuring a semiconductor device using the TEG is also shown.

The TEG shown in FIG. 12 includes series-coupled resistance elements R (R1 to R8) for testing, switches S (SaL, SaH, S1L to S8L, S1H to S8H) coupled to a coupling path coupling the resistance elements R, and selection circuits SEL (SEL1 to SEL8) for turning the switches S on or off to select a number of series-coupled resistance elements R to be measured as a group. The TEG shown in FIG. 12 also includes pads V, I, VH (VHa, VH1 to VH8), VL (VLa, VL1 to VL8).

Namely, the TEG of the present embodiment includes switches SaL and SaH to allow the eight series-coupled resistance elements to be measured as a group. The TEG also includes pads VHa, VLa corresponding to the switches SaL and SaH. For example, switch SaL is coupled between one end of resistance element R1 and pad VLa, and switch SaH is coupled between one end of resistance element R8 and pad VHa.

With the TEG having a circuit configuration as described above, the resistance measuring device TST includes select-a pin for switch selection. When "0" is inputted from the select-a pin, the eight series-coupled resistance elements can be measured as a group. When "1" is inputted from the select-a pin, the eight resistance elements can be measured individually. Namely, when switches SaL and SaH are turned on, the resistance of eight series-coupled resistance elements R1 to R8 can be measured.

Also, when "1" is inputted from the select-a pin, resistance elements R1 to R8 can be individually measured as in the first embodiment.

According to the semiconductor device and the measuring method therefor of the third embodiment described above, too, an effect similar to that of the first embodiment can be obtained. In addition, according to the third embodiment, one selection pin, i.e. the select-a pin, for selecting switches SaL and SaH is used compared with the two selection pins, i.e. the select-abcd pins, used in the first embodiment. Thus, according to the third embodiment like in the second embodiment, the number of selection pins can be decreased.

The invention made by the inventors has been concretely described based on embodiments. The present invention, however, is not limited to the foregoing embodiments and can be modified in various ways without departing from the scope thereof.

Though the foregoing embodiments have been described in detail to make the present invention easily understandable, the embodiments are not defined to include all the configurations thereof described in the foregoing. The configuration of any of the foregoing embodiments may be partly replaced by a configuration of another embodiment. The configuration of any of the foregoing embodiments may be added to by a configuration of another embodiment. Namely, the configuration of any of the foregoing embodiments may be partly deleted or may be partly added to or replaced by a configuration of another embodiment.

What is claimed is:

1. A semiconductor device comprising:
   a first resistance group including:
      a first resistance element, and
      a second resistance element coupled in series with the first resistance element;
   a second resistance group including:
      a third resistance element coupled in series with the second resistance element, and
      a fourth resistance element coupled in series with the third resistance element;
   a first switch group including: and
      a pair of first switches coupled with opposite ends of the first resistance group, respectively, and
      a pair of second switches coupled with opposite ends of the second resistance group, respectively;
   a second switch group including:
      a pair of third switches coupled with opposite ends of the first resistance element, respectively,
      a pair of fourth switches coupled with opposite ends of the second resistance element, respectively,
      a pair of fifth switches coupled with opposite ends of the third resistance element, respectively, and
      a pair of sixth switches coupled with opposite ends of the fourth resistance element, respectively.

2. The semiconductor device according to claim 1, further comprising:
   a selection circuit group including:
      a first selection circuit tuning on or off the pair of third switches,
      a second selection circuit tuning on or off the pair of fourth switches,
      a third selection circuit tuning on or off the pair of fifth switches, and a fourth selection circuit tuning on or off the pair of sixth switches.

3. The semiconductor device according to claim 1,
wherein the first resistance element has a first terminal and a second terminal;
wherein the second resistance element has a third terminal and a fourth terminal;
wherein the third resistance element has a fifth terminal and a sixth terminal;
wherein the fourth resistance element has a seventh terminal and an eighth terminal;
wherein the first and second resistance elements are coupled in series with each other such that the second terminal is connected with the third terminal;
wherein the second and third resistance elements are coupled in series with each other such that the fourth terminal is connected with the fifth terminal;
wherein the third and fourth resistance elements are coupled in series with each other such that the sixth terminal is connected with the seventh terminal;
wherein the pair of first switches is connected with the first terminal and the fourth terminal, respectively;
wherein the pair of second switches is connected with the fifth terminal and the eighth terminal, respectively;
wherein the pair of third switches is connected with the first terminal and the second terminal, respectively;
wherein the pair of fourth switches is connected with the third terminal and the fourth terminal, respectively;
wherein the pair of fifth switches is connected with the fifth terminal and the sixth terminal, respectively; and
wherein the pair of sixth switches is connected with the seventh terminal and the eighth terminal, respectively.

4. A method for testing the semiconductor device according to claim 1, the method comprising:
measuring first resistance of the first resistance group and second resistance of the second resistance group;
calculating difference between the first resistance and the second resistance;
determining resistance group having largest resistance; and
measuring resistance of each resistance element in determined the resistance group.

* * * * *